United States Patent [19]

Rumbaugh et al.

[11] Patent Number: 4,554,468
[45] Date of Patent: Nov. 19, 1985

[54] LATCHING COMPARATOR WITH HYSTERESIS

[75] Inventors: Robert C. Rumbaugh, Phoenix; Ira Miller, Tempe, both of Ariz.

[73] Assignee: Motorola, Inc., Schaumburg, Ill.

[21] Appl. No.: 510,044

[22] Filed: Jul. 1, 1983

[51] Int. Cl.$^4$ ............................................. H03K 5/24
[52] U.S. Cl. ................................ 307/355; 307/530; 307/288
[58] Field of Search ............... 307/355, 356, 530, 362, 307/288

[56] References Cited

U.S. PATENT DOCUMENTS

| | | | |
|---|---|---|---|
| 3,848,139 | 11/1974 | Holt, Jr. ................................ | 307/355 |
| 4,348,602 | 9/1982 | Sauer .................................... | 307/530 |
| 4,406,955 | 9/1983 | Lo Cascio ........................... | 307/355 |
| 4,430,580 | 2/1984 | Lovelace ............................. | 307/355 |

Primary Examiner—John Zazworsky
Attorney, Agent, or Firm—Vincent B. Ingrassia

[57] ABSTRACT

A self latching comparator circuit has upper and lower input offset voltages associated therewith to establish hysteresis in response to a differential input signal. The comparator circuit comprises a differential amplifier adapted to receive a differential input signal and first and second parallel current mirror circuits for producing upper and lower input offset voltages when each are respectively activated. Antisaturation means are provided for preventing the current mirror circuits from saturating. An output circuit is also provided which does not load the differential output and therefore provides for a well controlled hysteresis.

9 Claims, 1 Drawing Figure

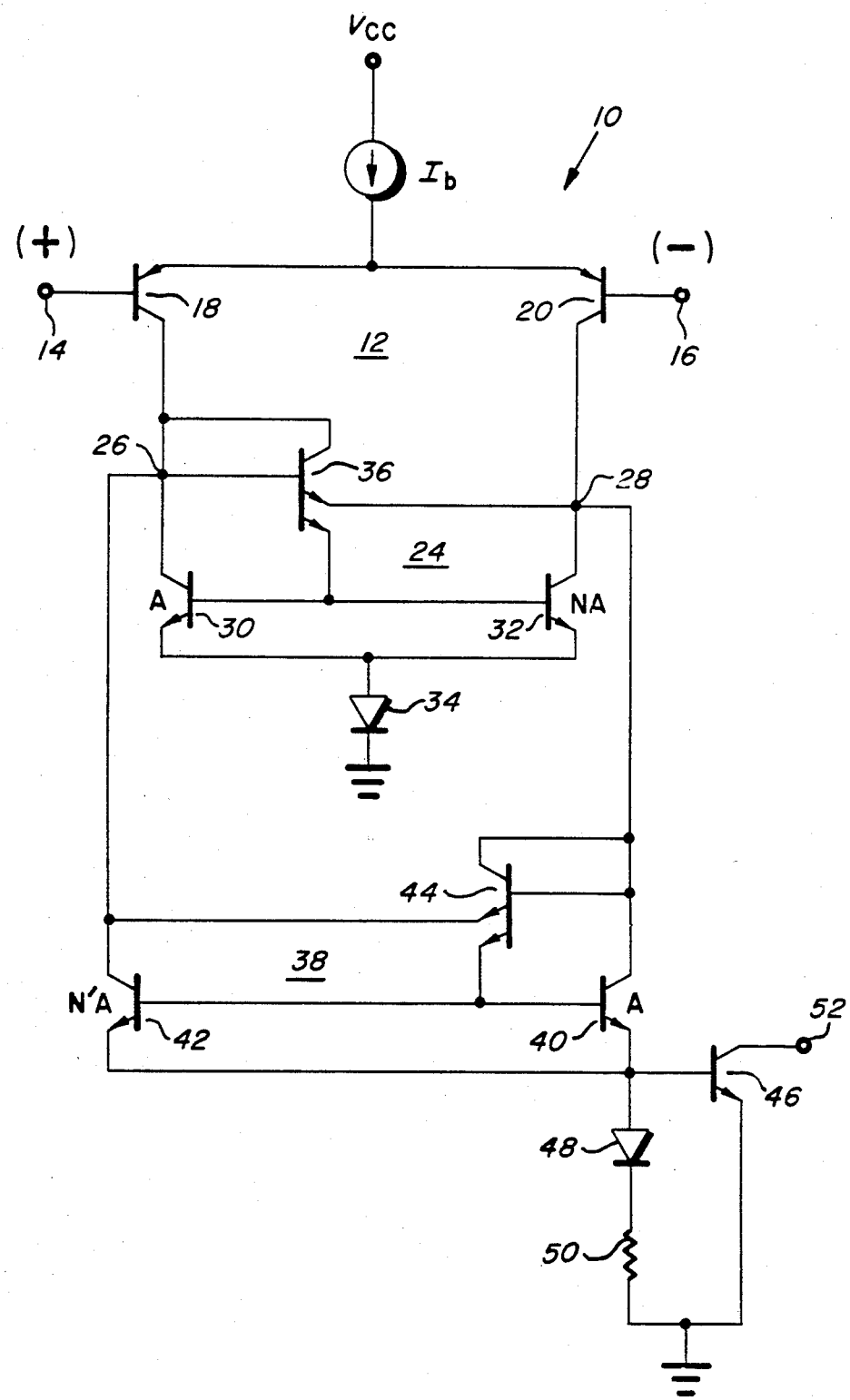

LATCHING COMPARATOR WITH HYSTERESIS

BACKGROUND OF THE INVENTION

This invention relates generally to comparator circuits and, more particularly, to an improved latching comparator circuit with hysteresis suitable for manufacture in integrated circuit form.

Differential comparator circuits for providing output level signals indicative of the magnitude of an input differential signal supplied thereto and having differential-to-single ended converter circuits associated therewith are well known in the art. Exemplary are those described in U.S. Pat. Nos. 3,649,846 and 3,872,323.

Generally, it is desirable to have zero input offset voltage so that as the magnitude of the differential input signal passes through the zero threshold level either in a positive or a negative sense, the output of the comparator circuit switches between two output level states. However, some comparator circuits are utilized in a high noise environment where relatively high noise transients may be generated. For example, if a noise transient occurs at or near the time that the differential input signal crosses through the zero threshold level, the output of the comparator circuit can be caused to erroneously switch output states due solely to the noise transient.

To overcome the problems associated with noise, some comparator circuits employ hysteresis which is generated internal to the comparator circuit itself. One such circuit is shown and described in U.S. Pat. No. 3,848,139 filed Sept. 14, 1973 issued Nov. 12, 1974 and entitled "High-Gain Comparator Circuit". Another such circuit is shown and described in copending U.S. Pat. No. 4,406,955 issued Sept. 27, 1983 entitled "Comparator Circuit Having Hysteresis" and assigned to the assignee of, the present invention. Unfortunately, these circuits suffer several disadvantages. First, no means are provided to prevent the current mirrors from saturating and such saturation will reduce the switching speed of the circuit and cause increased currents to flow in the substrate. Second, the output(s) is (are) taken from the collector(s) of the current mirror transistors which loads the input differential transistor pair and causes a loss of control of the hysteresis.

SUMMARY OF THE INVENTION

It is an object of the present invention to provide an improved latching comparator with hysteresis.

It is a further object of the present invention to provide a latching comparator with hysteresis wherein the input differential pair is not loaded by the output.

It is a still further object of the present invention to provide a latching comparator with hysteresis which utilizes non-saturating current mirror circuits.

According to a broad aspect of the invention there is provided a self latching comparator circuit having hysteresis, comprising differential amplifier means having first and second inputs and first and second outputs, the first and second inputs being responsive to a differential signal applied thereacross. A first current mirror means is coupled to the first and second outputs for producing a first predetermined input offset voltage in said differential amplifier means when the first current mirror means is activated, the first current mirror means including first transistor means. A second current mirror means is coupled between the first and second outputs and a common node for producing a second predetermined input offset voltage in the differential amplifier means when the second current mirror means is activated, the second current mirror means being activated when the magnitude of the differential input signal incrementally exceeds the first predetermined input offset voltage in a positive sense for regeneratively inactivating the first current mirror means and the first current mirror means being activated when the magnitude of the differential input signal incrementally exceeds the second input offset voltage in a negative sense for regeneratively inactivating the second current mirror means. The second current mirror means includes second transistor means. First means are provided for preventing the first transistor means from saturating when the first current mirror means is activated, and second means are provided for preventing the second transistor means from saturating when the second current mirror means is activated. An output circuit means is coupled to the common node for causing a voltage level at an output thereof to switch between first and second output level states after the first and second current mirror means are respectively activated.

BRIEF DESCRIPTION OF THE DRAWING

The above and other objects, features and advantages of the present invention will be more clearly understood from the following detailed description taken in conjunction with the accompanying drawing which is a schematic diagram of the inventive latching comparator circuit.

DESCRIPTION OF THE PREFERRED EMBODIMENT

Referring to the drawing, comparator 10 comprises a differential amplifier 12 having differential inputs 14 and 16 adapted to receive a differential input signal applied thereacross. Differential amplifier 12 comprises PNP transistors 18 and 20 which are emitter coupled via bias current source 22 to a source of supply voltage $V_{CC}$. The base electrodes of transistors 18 and 20 are coupled respectively to inputs 14 and 16. The differential output of amplifier 12 is taken at the collectors of transistors 18 and 20 and, as is well known, in response to the differential input signal differential currents flow from the collectors of transistors 18 and 20.

A first current mirror circuit 24 is coupled to the differential outputs of differential amplifier 12 at nodes 26 and 28. Current mirror circuit 24 includes NPN transistors 30 and 32 having emitter areas A and NA respectively (N greater than 1) having their base electrodes coupled together and their emitters coupled via diode 34 to a second source of supply voltage (in this case ground). The collectors of transistors 30 and 32 are coupled to nodes 26 and 28 respectively. A dual emitter NPN transistor 36 has its base and collector terminals coupled to node 26, has a first emitter coupled to node 28 and a second emitter coupled to the base electrodes of transistors 30 and 32. The second emitter of transistor 36 diode couples the base and collector terminals of transistor 30 as is well known. That is, since the base and collector terminals of transistor 36 are coupled together and to the collector of transistor 30 and since the second emitter of transistor 36 is coupled to the base of transistor 30, transistor 36 excluding the first emitter and transistor 30 function as a diode coupled between the base of transistor 32 and the anode of diode 30. The first emitter of transistor 36 functions to prevent transistor 32 from saturating in a manner which will be described below.

Coupled in parallel with current mirror circuit 24 and to the differential output of differential pair 12 is a second current mirror circuit 38 including NPN transistors 40 and 42 having emitter areas A and N'A respectively (N' greater than 1). Current mirror circuit 38 also includes NPN transistor 44 having a first emitter coupled to the collector of transistor 42 and a second emitter coupled to the base of transistor 40. The base and collector electrodes of transistor 44 are coupled to the collector of transistor 40 to provide the required diode coupling. The first emitter of transistor 44 prevents transistor 42 from saturating as will be described below. It is important to note that while transistor 36 in current mirror 24 and transistor 44 in current mirror 38 are shown as dual emitter transistors, the same function could be accomplished using two separate transistors.

The emitters of transistors 40 and 42 are coupled to the base of output transistor 46 and to the anode of diode 48 which may be a diode coupled transistor. NPN transistor 46 has an emitter area which is larger (e.g. ten times) than the anode area of diode 48. The cathode of diode 48 is coupled to ground via resistor 50. Transistor 46 has an emitter coupled to ground and a collector coupled to output terminal 52.

The operation of this circuit may be described as follows. If we assume that the potential appearing at the input terminal 14 is less than the potential appearing at input terminal 16, by an amount much greater than the input offset voltage $V_{TU}$ then current mirror 24 will be in its active state. That is, transistor 30 be rendered conductive by the differential current I flowing from transistor 18. Due to the current mirror action in the circuit, and if for example N=2, transistor 32 will attempt to draw a current 2I from node 28. Since no current is flowing from transistor 20 into node 28, no current will flow into current mirror circuit 38. Furthermore, the voltage at node 28 is clamped to $2V_{BE}$ where $V_{BE}$ is the base-emitter voltage of a transistor. As can be seen, a voltage of $3V_{BE}$ is necessary at the base of transistor 44 to render current mirror circuit 38 active. It should be noted that since node 28 is coupled to an emitter of transistor 36, transistor 32 will be prevented from saturating. That is, as transistor 32 requires more current, current is drawn from the collector of transistor 18 via transistor 36 thus reducing the current that is mirrored at the collector of transistor 32 and keeping it out of saturation.

As is understood by those skilled in the art, the balance state of current mirror circuit 24 occurs when the current from transistor 20 is N times greater than the current flowing from transistor 18. Thus, whenever the differential input signal reaches this offset voltage level, the differential current supplied from differential amplifier 12 to current mirror 24 is such as to set current mirror 24 in a balanced condition. It can be shown that this input voltage (VTU) is equal to $$VTU = n\frac{kT}{q} \ln N$$

where n is a high current injection factor typically equal to 1, k is Boltzmann's constant, T is the absolute temperature, and q is the charge of an electron. Thus, under the situation described above (i.e. current mirror circuit 24 active and current mirror circuit 38 inactive), a high level state will appear at output terminal 52 since transistor 46 is in a nonconducting state.

As the differential input signal changes and the voltage appearing at input terminal 16 is sufficiently less than that appearing at input terminal 14 such that the current flowing from the collector of transistor 20 is N times greater than the collector current from transistor 18, any further incremental change in this voltage will cause an incremental excess current to flow from node 28 to current mirror circuit 38. When this current is sufficient to produce a mirrorable current through current mirror 38, a positive regeneration occurs wherein current mirror 24 is quickly rendered inactive by transistor 42 pulling current out of node 26. Thus, as a mirrorable current renders transistors 40 and 44 conductive, transistor 42 is in turn rendered conductive. Transistor 42 has an emitter area N' times the emitter of transistor 40 and wants to conduct N' times as much collector current which causes current to be sourced from node 26. This renders transistor 30 of current mirror 24 less conductive. The amount of collector current which is sourced by transistor 32 is decreased which allows more current to be sourced from node 28 to the collector of transistor 40, which in turn causes transistor 42 to conduct harder and source more current from node 26. In this manner, current mirror circuit 24 is quickly rendered inactive.

With transistors 40 and 42 rendered conductive, current flows into the base of transistor 46 and through diode 48 and resistor 50. With transistor 46 rendered conductive, output terminal 52 now falls to a second voltage level.

As was described earlier in connection with current mirror circuit 24, transistor 44 has a first emitter which is coupled to the collector of transistor 42. This prevents transistor 42 from saturating in that as transistor 42 attempts to conduct more current, current is diverted through transistor 44 from the collector of transistor 40. By preventing transistors 32 and 42 from going into saturation, the overall switching speed of the circuit is further enhanced.

Finally, it should be noted that since the output transistor 46 is taken off the emitters of transistor 40 and 42, the amount of hysteresis can be well controlled since there is no loading of nodes 26 and 28.

As current mirror circuit 38 is rendered active, the input offset voltage of comparator circuit 10 is decreased to a second value equal to:

$$VTL = n\frac{kT}{q} \ln N'$$

Output terminal 52 will remain at the lower level until such time as the differential input signal reaches the second input offset voltage VTL at which time the collector current of transistor 18 becomes N' times the collector current of transistor 20. Any further incremental voltage change in the input voltage below this lower offset voltage will produce a mirrorable current in transistor 30 which causes a regenerative feedback process as described above with respect to the inactivation of current mirror circuit 24. Thus, current mirror circuit 38 becomes inactive and current mirror circuit 24 will become active without any further changes in the input voltage occurring. When current mirror circuit 24 is activated, the input offset voltage of comparator circuit 10 is increased to the level VTU prior to the output level state at terminal 52 switching to the upper level state. The total hysteresis is:

$$V_T = V_{TU} + V_{TL} = n \ln NN'$$

In summary, as a differential input signal varies between the upper and lower input offset voltage levels, hysteresis occurs prior to the output of the comparator being switched and hence the comparator is not sensitive to noise transients. The antisaturation features of current mirror circuits 24 and 38 improve the switching speed of the circuit. Furthermore, it should be apparent that the amount of hysteresis, as well as the magnitude of the upper and lower offset voltages, can be varied by varying the emitter area ratios N and N' accordingly. Finally, since output transistor is coupled to the emitter of transistor 40 and not to nodes 26 or 28, the hysteresis is well controlled.

The above description is given by way of example only. Changes in form and details may be made by one skilled in the art without departing from the scope of the invention.

We claim:

1. A self latching comparator circuit having hysteresis, comprising:
    differential amplifier means having first and second inputs and first and second outputs, said first and second inputs being responsive to a differential signal applied thereacross;
    first current mirror means coupled to said first and second outputs for producing a first predetermined input offset voltage in said differential amplifier means when said first current mirror means is activated, said first current mirror means including first transistor means;
    second current mirror means coupled between said first and second outputs and a common node for producing a second predetermined input offset voltage in said differential amplifier means when said second current mirror means is activated, said second current mirror means being activated when the magnitude of said differential input signal incrementally exceeds said first predetermined input offset voltage in a positive sense for regeneratively inactivating said first current mirror means and said first current mirror means being activated when the magnitude of the differential input signal incrementally exceeds said second input offset voltage in a negative sense for regeneratively inactivating said second current mirror means, said second current mirror means including second transistor means;
    first means for preventing said first transistor means from saturating when said first current mirror means is activated;
    second means for preventing said second transistor means from saturating when said second current mirror means is activated; and
    output circuit means coupled to said common node for causing a voltage level at an output thereof to switch between first and second output level states after said first and second current mirror means are respectively activated.

2. A circuit according to claim 1 wherein said first current mirror means includes: first diode means coupled between said first output and a first source of supply voltage, said first transistor means having base, emitter and collector terminals, said emitter terminal coupled to said first source of supply voltage, said collector terminal coupled to said second output, and said base terminal coupled to said first diode means.

3. The circuit according to claim 2 wherein said second current mirror means includes second diode means coupled between said second output and said first source of supply voltage, said second transistor means having base, emitter and collector terminals, said collector terminal coupled to said first output, said emitter terminal coupled to said first source of supply voltage and said base terminal coupled to said second diode means.

4. A circuit according to claim 3 wherein said first diode means includes third transistor means having base, emitter and collector terminals, said emitter terminal being coupled to said first source of supply voltage, and said base terminal and collector terminal being coupled to said first output and to the base terminal of said first transistor means, the emitter area of said first transistor means being N times greater than the emitter area of said third transistor means.

5. A comparator circuit according to claim 4 wherein said second diode means includes fourth transistor means having base, emitter and collector terminals, said emitter terminal coupled to said first source of supply voltage, and said base and collector terminals being coupled to said second output and to the base terminal of said second transistor means, the emitter area of said second transistor means being N' times greater than the emitter area of said fourth transistor means.

6. A comparator circuit according to claim 5 wherein said first means comprises fifth transistor means having base, emitter and collector terminals, said base and collector terminals being coupled to said first output and said emitter terminal being coupled to said second output.

7. A circuit according to claim 6 wherein said second means comprises sixth transistor means having base, emitter and collector terminals, said base and collector terminals being coupled to said second output and the emitter terminal being coupled to said first output.

8. A compprator circuit according to claim 5 wherein said first means comprises a dual emitter transistor having base and collector terminals coupled to said first output, having a first emitter terminal coupled to said second output, and a second emitter terminal coupled to the base terminal of said third transistor means.

9. The circuit according to claim 8 wherein said second means comprises a dual emitter transistor having base and collector terminals coupled to said second output, a first emitter terminal coupled to said first output and a second emitter terminal coupled to the base of said fourth transistor means.

* * * * *

UNITED STATES PATENT AND TRADEMARK OFFICE
CERTIFICATE OF CORRECTION

PATENT NO. : 4,554,468

DATED : November 19, 1985

INVENTOR(S) : Robert C. Rumbaugh; Ira Miller

It is certified that error appears in the above-identified patent and that said Letters Patent is hereby corrected as shown below:

Column 6, claim 8, line 49, change "compprator" to

--comparator--.

Signed and Sealed this

Fourth Day of November, 1986

[SEAL]

Attest:

DONALD J. QUIGG

Attesting Officer

Commissioner of Patents and Trademarks